US011179809B2

(12) United States Patent
Ono

(10) Patent No.: US 11,179,809 B2
(45) Date of Patent: Nov. 23, 2021

(54) MANUFACTURING METHOD OF GLASS SUBSTRATE HAVING HOLES, MANUFACTURING METHOD OF INTERPOSER SUBSTRATE, AND METHOD FOR FORMING HOLE IN GLASS SUBSTRATE

(71) Applicant: AGC INC., Chiyoda-ku (JP)

(72) Inventor: Motoshi Ono, Tokyo (JP)

(73) Assignee: AGC INC., Chiyoda-ku (JP)

( * ) Notice: Subject to any disclaimer, the term of this patent is extended or adjusted under 35 U.S.C. 154(b) by 293 days.

(21) Appl. No.: 16/375,036

(22) Filed: Apr. 4, 2019

(65) Prior Publication Data

US 2019/0224783 A1    Jul. 25, 2019

Related U.S. Application Data

(63) Continuation of application No. PCT/JP2017/037901, filed on Oct. 19, 2017.

(30) Foreign Application Priority Data

Oct. 20, 2016  (JP) .............................. JP2016-206083

(51) Int. Cl.
*C03C 15/00* (2006.01)
*B23K 26/362* (2014.01)
(Continued)

(52) U.S. Cl.
CPC ........ *B23K 26/362* (2013.01); *B23K 26/0853* (2013.01); *B23K 26/382* (2015.10);
(Continued)

(58) Field of Classification Search
None
See application file for complete search history.

(56) References Cited

U.S. PATENT DOCUMENTS 5,493,096 A * 2/1996 Koh ...................... H01L 21/486
                                                       219/121.71
5,690,846 A   11/1997 Okada et al.
(Continued)

FOREIGN PATENT DOCUMENTS

JP           8-174256            7/1996
JP         2002-316288          10/2002
(Continued)

OTHER PUBLICATIONS

International Search Report dated Jan. 23, 2018 in PCT/JP2017/037901 filed on Oct. 19, 2017 (with English Translation).
Written Opinion dated Jan. 23, 2018 in PCT/JP2017/037901 filed on Oct. 19, 2017.

*Primary Examiner* — Shamim Ahmed
(74) *Attorney, Agent, or Firm* — Oblon, McClelland, Maier & Neustadt, L.L.P.

(57) ABSTRACT

A manufacturing method of a glass substrate having holes includes irradiating a plurality of hole formation target positions of a dummy glass substrate with a laser under a first condition, to form a plurality of holes in the dummy glass substrate; heating the dummy glass substrate under a second condition; measuring, for each of the hole formation target positions, a deviation between the hole formation target position and a position of the hole after the heating formed by irradiating the hole formation target position of the dummy glass substrate; irradiating irradiation target positions of a glass substrate, having substantially same shape, dimension and composition as the dummy glass substrate, with a laser under the first condition, to form a plurality of holes, the irradiation target positions of the glass substrate with the laser being determined taking into account the deviation; and heating the glass substrate under the second condition.

6 Claims, 8 Drawing Sheets

(51) Int. Cl.
*C03B 25/02* (2006.01)
*B23K 26/08* (2014.01)
*B23K 26/402* (2014.01)
*B23K 26/60* (2014.01)
*H01L 21/48* (2006.01)
*B23K 26/382* (2014.01)
*B23K 26/70* (2014.01)
*H01L 23/15* (2006.01)
*B23K 103/00* (2006.01)

(52) U.S. Cl.
CPC ............ *B23K 26/402* (2013.01); *B23K 26/60* (2015.10); *B23K 26/702* (2015.10); *C03B 25/02* (2013.01); *C03C 15/00* (2013.01); *H01L 21/486* (2013.01); *B23K 2103/54* (2018.08); *H01L 23/15* (2013.01)

(56) References Cited

U.S. PATENT DOCUMENTS

| | | | |
|---|---|---|---|
| 9,205,698 B2 * | 12/2015 | Horiuchi | H01L 21/486 |
| 2013/0089701 A1 * | 4/2013 | Hooper | B23K 26/382 |
| | | | 428/131 |
| 2013/0247615 A1 * | 9/2013 | Boek | B23K 26/402 |
| | | | 65/29.1 |
| 2018/0037489 A1 * | 2/2018 | Ono | C03B 33/082 |

FOREIGN PATENT DOCUMENTS

| | | | |
|---|---|---|---|
| JP | 2009-66641 | | 4/2009 |
| JP | 2013-086236 | | 5/2013 |
| JP | 2015-80800 | | 4/2015 |
| JP | 2015-107510 | | 6/2015 |
| JP | 2015107510 A | * | 6/2015 |
| JP | 2016-55295 | | 4/2016 |

* cited by examiner

MANUFACTURING METHOD OF GLASS SUBSTRATE HAVING HOLES, MANUFACTURING METHOD OF INTERPOSER SUBSTRATE, AND METHOD FOR FORMING HOLE IN GLASS SUBSTRATE

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2017/037901 filed on Oct. 19, 2017 and designating the U.S., which claims priority of Japanese Patent Application No. 2016-206083 filed on Oct. 20, 2016. The entire contents of the foregoing applications are incorporated herein by reference.

BACKGROUND OF THE INVENTION

1. Field of the Invention

The disclosure herein generally relates to a manufacturing method of a glass substrate having holes, a manufacturing method of interposer substrate, and a method for forming a hole in a glass substrate.

2. Description of the Related Art

A technique for forming a through-hole in a glass substrate by using a laser beam has been known. In this technique, a through-hole can be formed in the glass substrate by irradiating a predetermined position of the glass substrate with laser light.

Note that in the glass substrate after the processing a residual stress and/or a warpage may occur. Thus, in some case, a heat treatment is performed on the glass substrate after the processing to relieve the influence of the residual stress and/or warpage. However, as a result, according to the heat treatment, the position of the through-hole may slightly deviate from the predetermined position.

Thus, a method of determining the influence of a heat treatment on a deviation position of a through-hole using a dummy glass substrate, and in a state where the influence is "taken into account", performing the through-hole processing and heat-treating an actual glass substrate has been proposed (See, for example, Japanese Unexamined Patent Application Publication No. 2015-107510).

SUMMARY OF THE INVENTION

Technical Problem

However, the inventors of the present invention have discovered that even if the "correction" described in Japanese Unexamined Patent Application Publication No. 2015-107510 is performed, the position of the through-hole may still deviate from the predetermined position after heat-treating the glass substrate.

Such a deviation of the through-hole position may be a serious problem even if the deviation is small, for example, in the field of semiconductor devices, in which highly accurate machining is required, such as an interposer substrate.

Moreover, such a problem is not limited to the case of formation of a through-hole in a glass substrate, and may occur typically in a case of forming a hole such as a blind hole in a glass substrate.

The present invention has been made in view of the background, and the present invention aims to provide a manufacturing method of a glass substrate having holes, in which a hole can be arranged at a desired position with high accuracy even after a heat treatment. Moreover, the present invention aims at providing a manufacturing method of an interposer substrate having the above-described glass substrate. Furthermore, the present invention aims to provide a method for forming a hole in a glass substrate, in which a hole can be arranged at a desired position with high accuracy, after a heat treatment.

Means for Solving the Problem

An aspect of the present invention provides a manufacturing method of a glass substrate having holes, the method including irradiating a plurality of hole formation target positions of a dummy glass substrate with a laser under a first condition, to form a plurality of holes in the dummy glass substrate; heating the dummy glass substrate under a second condition; measuring, for each of the hole formation target positions, a deviation between the hole formation target position and a position of the hole after the heating formed by irradiating the hole formation target position of the dummy glass substrate with a laser; irradiating irradiation target positions of a glass substrate, having substantially same shape, dimension and composition as the dummy glass substrate, with a laser under the first condition, to form a plurality of holes, the irradiation target positions of the glass substrate with the laser being determined taking into account the deviation; and heating the glass substrate under the second condition.

Another aspect of the present invention provides a method for forming holes in a glass substrate including irradiating a plurality of hole formation target positions of a dummy glass substrate with a laser under a first condition, to form a plurality of holes in the dummy glass substrate; heating the dummy glass substrate under a second condition; measuring, for each of the hole formation target positions, a deviation between the hole formation target position and a position of the hole after the heating formed by irradiating the hole formation target position of the dummy glass substrate with a laser; irradiating irradiation target positions of a glass substrate, having substantially same shape, dimension and composition as the dummy glass substrate, with a laser under the first condition, to form a plurality of holes, the irradiation target positions of the glass substrate with the laser being determined taking into account the deviation; and heating the glass substrate under the second condition.

Another aspect of the present invention provides a manufacturing method of an interposer substrate including irradiating a plurality of through hole formation target positions of a dummy glass substrate with a laser under a first condition, to form a plurality of through holes in the dummy glass substrate; heating the dummy glass substrate under a second condition; measuring, for each of the through hole formation target positions, a deviation between the through hole formation target position and a position of the through hole after the heating formed by irradiating the through hole formation target position of the dummy glass substrate with a laser; irradiating irradiation target positions of a glass substrate, having substantially same shape, dimension and composition as the dummy glass substrate, with a laser under the first condition, to form a plurality of through holes, the irradiation target positions of the glass substrate with the laser being determined taking into account the deviation; heating the glass substrate under the second condition; and filling a conductive material in the through holes in the glass substrate.

Effect of Invention

The present disclosure provides a manufacturing method of a glass substrate having holes in which holes can be arranged at desired positions with high accuracy even after a heat treatment. Moreover, the present disclosure provides a manufacturing method of an interposer substrate having the above-described glass substrate. Furthermore, the present disclosure provides a method for forming a hole in a glass substrate, in which a hole can be arranged at a desired position with high accuracy, after a heat treatment.

BRIEF DESCRIPTION OF THE DRAWINGS

Other objects and further features of embodiments will become apparent from the following detailed description when read in conjunction with the accompanying drawings, in which.

DETAILED DESCRIPTION OF THE PREFERRED EMBODIMENTS

Figure 1:
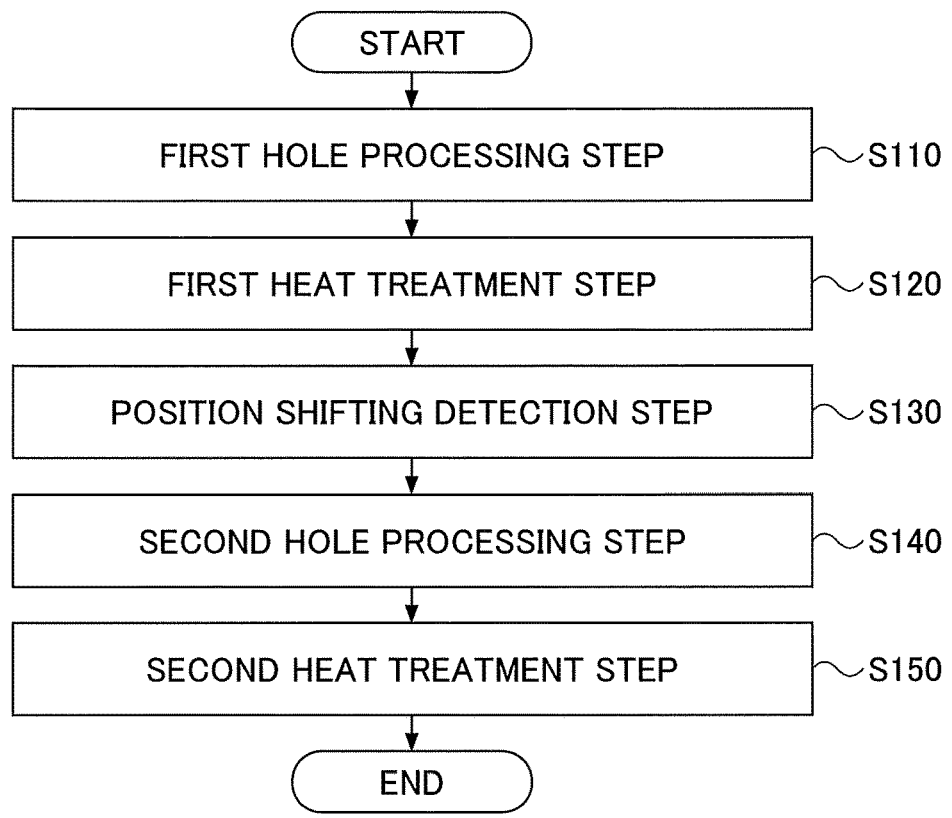
FIG. 1 is a flowchart schematically depicting an example of a flow of the manufacturing method of a glass substrate having holes according to an embodiment of the present invention.

In the following, an embodiment of the present invention will be described.

As described above, in the case of heat-treating a glass substrate after a through hole processing, a position of the through hole may slightly deviate from a predetermined position due to the influence of the heat treatment. Moreover, in order to solve the problem, a method of determining the influence of the heat treatment on a deviation position of a through-hole using a dummy glass substrate has been proposed. In this method, in a state where the influence is "corrected", the through-hole processing is performed and an actual glass substrate is heat-treated.

However, the inventors of the present invention have discovered that even if the "correction" described in Japanese Unexamined Patent Application Publication No. 2015-107510 is performed, the position of the hole (e.g. through-hole) may still deviate from the predetermined position after heat-treating the glass substrate.

This suggests that only determining the influence of a heat treatment of a glass substrate on a deviation position of a hole and correcting the position based on the influence are insufficient for suppressing the deviation position of the hole. In other words, without specifying a cause, which can generate the deviation position of the hole, over the entire process of manufacturing the glass substrate having holes, and performing correction taking into account the cause, it is difficult to arrange holes at predetermined positions with sufficiently high accuracy after heat-treating the glass substrate.

The inventors of the present application, from the above-described viewpoint, in particular, during the process from the hole processing step by irradiating laser light to the heat treatment step, have studied a cause that can generate the deviation in the position of the hole. As a result, the inventors found that the deviation position of the hole can occur also during the hole processing by irradiating with laser light, in addition to the heat treatment step, and arrived at the present invention. Note that the deviation position of the hole during the hole processing by irradiating with laser light is considered to occur due to a contraction of the glass substrate that occurs after the heat treatment.

Thus, the present invention provides a manufacturing method of a glass substrate having holes, including a step (a) of irradiating a plurality of hole formation target positions on a dummy glass substrate with a laser light under a first condition, to form a plurality of holes in the dummy glass substrate;

a step (b) of heat-treating the dummy glass substrate;

a step (c) of measuring, for each of the hole formation target positions, a deviation between the hole formation target position and a position of the hole after the heat treatment in the step (b);

a step (d) of irradiating irradiation target positions of a glass substrate, having substantially same shape, dimension and composition as those of the dummy glass substrate, with a laser light under the first condition, to form a plurality of holes, the irradiation target positions of the glass substrate with the laser light being determined taking into account the amounts of deviation measured in the step (c); and a step (e) of heat-treating the glass substrate under a heat treatment condition that is applied to the step (b).

In the present invention, in a state where both the contraction of the glass substrate during the hole processing and the contraction of the glass substrate that occurs after the heat treatment are taken into account, the hole formation processing is performed for the glass substrate. Moreover, in order to realize the above-described process, in the present invention, a dummy glass substrate having the same specification as the glass substrate is used.

More specifically, in the present invention, before performing the hole formation processing for a glass substrate that is an object of the main processing, the hole formation processing and the heat treatment are performed for the dummy glass substrate. Moreover, in the dummy glass substrate, an "amount of deviation", in which the influence of the deviation position of the hole during the hole processing or the deviation of the hole position due to the heat treatment is taken into consideration, is determined. Moreover, the main processing, i.e. the hole formation processing for the glass substrate, is performed taking into account the amount of deviation for each hole as measured in the dummy glass substrate.

In this case, when the hole processing is performed for the glass substrate under the same condition as that for the dummy glass substrate, and the heat treatment after the hole processing is performed under the same condition as that for the dummy glass substrate for the glass substrate, the position of each hole deviates by the amount of deviation that was measured in the dummy glass substrate. As a result, after the heat treatment, each hole is arranged at a target position on the glass substrate.

Thus, according to the method of the present invention, after the heat treatment, each hole can be arranged at the target position with high accuracy.

(Manufacturing Method of Glass Substrate Having Holes According to Embodiment of Present Invention)

Next, with reference to the drawings, a manufacturing method of a glass substrate having holes according to an embodiment of the present invention will be described.

FIG. 1 is a flowchart schematically depicting an example of the flow of the manufacturing method of the glass substrate having holes according to the embodiment of the present invention (in the following, referred simply to as a "first method").

As illustrated in FIG. 1, the first method includes (a) a first hole processing step of irradiating a plurality of hole formation target positions on a dummy glass substrate with a laser light under a first condition using a laser light, to form a plurality of holes in the dummy glass substrate (step S110);

(b) a first heat treatment step of heat-treating the dummy glass substrate (step S120);

(c) a position deviation measuring step of measuring, for each of the hole formation target positions, a deviation between the hole formation target position and a position of the hole after the heat treatment in the step (b) (step S130);

(d) a second hole processing step of irradiating irradiation target positions of a glass substrate, having substantially same shape, dimension and composition as those of the dummy glass substrate, with a laser light under the first condition, to form a plurality of holes. The irradiation target positions of the glass substrate with the laser light are determined taking into account the amounts of deviation measured in the step (c) (step S140); and (e) a second heat treatment step of heat-treating the glass substrate under a heat treatment condition that is applied to the step (b) (step S150).

Each step will be described in detail as follows:

(Step S110)

First, a dummy glass substrate is prepared.

Figure 2:
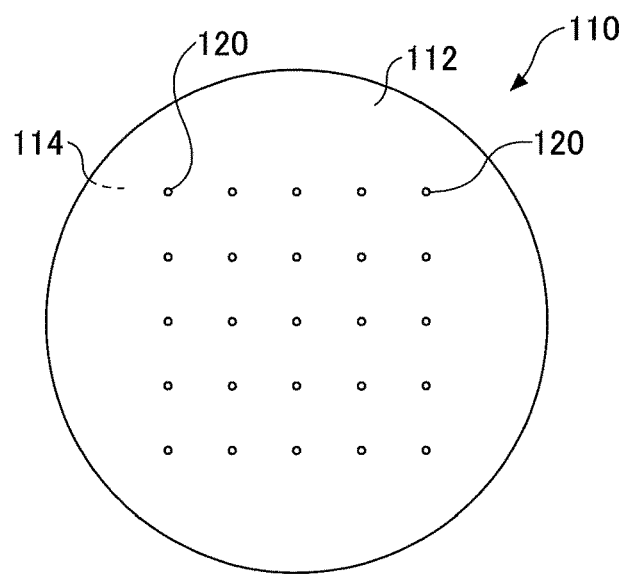
FIG. 2 is a diagram schematically depicting an example of a form of the dummy glass substrate.

FIG. 2 schematically depicts an example of a form of the dummy glass substrate according to the embodiment.

As illustrated in FIG. 2, the dummy glass substrate 110 has a first surface 112 and a second surface 114 that face each other. The second surface is not visible from FIG. 2). The first surface 112 of the dummy glass substrate 110 corresponds to the surface that is irradiated with laser light, on which a plurality of holes are formed.

The dummy glass substrate 110 is a substrate having at least substantially the same shape, dimension and composition as those of the glass substrate used in the subsequent step S140 (in the following, referred to as a "glass substrate for main processing"). The dummy glass substrate 110 may be substantially the same as the glass substrate for main processing. Note that the phrase "being substantially the same" means completely the same. Moreover, the phrase also means that a difference in a shape, a dimension and a composition inevitably occurring in manufacturing is allowed.

Note that the shape of a main surface of the dummy glass substrate 110 (and of the glass substrate for main processing) is not particularly limited, and may be a shape of a wafer (circular shape), illustrated in FIG. 2, a rectangular shape, a square shape or the like.

The thickness of the dummy glass substrate 110 may fall within a range of 0.05 mm to 0.70 mm, for example.

Next, each "hole formation target position" 120 on the first surface 112 of the dummy glass substrate 110 is irradiated with a laser light. Moreover, according to the irradiation of laser light, a plurality of holes are formed on the first surface 112.

In the present application, originally, the "hole formation target position" means a target position, at which each hole is to be disposed after the second heat treatment step (step S150) on the first surface of the glass substrate for main processing. However, as described above, the dummy glass substrate 110 has the same shape and dimension as those of the glass substrate for main processing. Thus, also on the dummy glass substrate 110, the hole formation target position 120 can be set at the same position as that of the glass substrate for main processing. In other words, the hole formation target position 120 on the dummy glass substrate 110 corresponds to (coincides with) the hole formation target position on the glass substrate for main processing.

For example, in FIG. 2, hole formation target positions 120 of 5 rows×5 columns, i.e. 25 in total, on the first surface 112 of the dummy glass substrate 110 are illustrated. The hole formation target positions 120 correspond to (coincide with) the hole formation target positions arranged on the first surface of the glass substrate for main processing, respectively.

The laser processing technique used in the present step is not particularly limited as long as it is a technique using laser light.

An example of a laser processing method will be briefly described with reference to FIG. 3.

Figure 3:
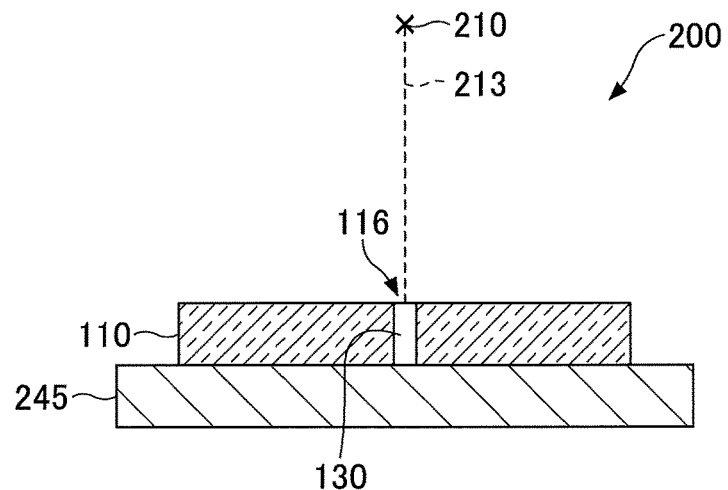
FIG. 3 is a diagram schematically depicting an example of a laser beam processing device that can be used for forming a plurality of holes in a dummy glass substrate by irradiating the dummy glass substrate with a laser light.

FIG. 3 schematically depicts an example of a laser processing device that can be used for irradiating the dummy glass substrate 110 with laser light to form a plurality of holes.

As illustrated in FIG. 3, the laser processing device 200 has a laser light source 210 and a sample stage 245.

The type of the laser light source 210 is not particularly limited, and the laser light source 210 may be a $CO_2$ laser or a UV laser. The dummy glass substrate 110 is placed on the sample stage 245.

When the hole formation processing is performed for the dummy glass substrate 110 using the above-described laser processing device 200, first the dummy glass substrate 110 is placed on the sample stage 245. Furthermore, by moving the sample stage 245 in the horizontal direction, the dummy glass substrate 110 is brought to a predetermined position.

Next, the dummy glass substrate 110 is irradiated with the laser light 213 emitted from the laser light source 210. According to the irradiation, the temperature at the irradiation position 116 for the laser light 213 on the dummy glass substrate 110 increases locally, an insulating material sublimes, then a hole 130 is formed.

Note that in the example shown in FIG. 3, the hole 130 is a through-hole. However, this is merely an example, and the hole 130 may be a blind hole.

Next, the sample stage 245 is moved in the horizontal direction so as to bring the dummy glass substrate 110 at a predetermined position. Thereafter, according to the same processing, a second hole is formed.

By repeating the above-described process, a plurality of holes 130 can be formed in the dummy glass substrate 110.

In the present application, for simplicity, the condition for the processing in the present step, i.e. a processing of forming a hole 130 on the dummy glass substrate 110 by irradiation of laser light, will be collectively referred to as a "first condition". The "first condition" includes a kind of a laser beam, a power of the laser beam, an irradiation distance, an irradiation time, a spot diameter of the laser beam, and the like.

Figure 4:
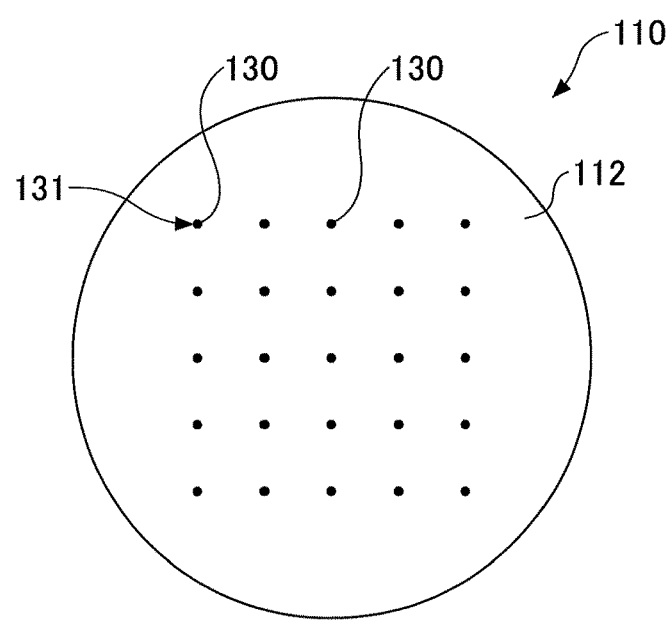
FIG. 4 is a diagram schematically depicting an example of a plurality of holes formed in a first surface of the dummy glass substrate.

FIG. 4 schematically depicts an example of a plurality of holes 130 formed on the first surface 112 of the dummy glass substrate 110.

As illustrated in FIG. 4, holes 130 of 5 rows×5 columns, i.e. 25 in total, are formed on the first surface 112 of the dummy glass substrate 110. In the following, the position where each hole 130 is arranged will be referred to as a "hole processing position (131)".

The dimension of an opening of each hole 130 is not particularly limited. For example, a diameter of the opening may fall within a range from 20 μm to 300 μm. However, the opening dimensions of the respective holes 130 are not necessarily required to be the same. The respective holes 130 may have different opening dimensions.

As described above, it should be noted that the hole processing position 131 of each hole 130 actually formed on the first surface 112 may slightly deviate from the hole formation target position 120, illustrated in FIG. 2. However, in FIG. 4, in order to prevent the figure from becoming complicated, the hole processing position 131 of each hole 130 is shown to coincide with the hole formation target position 120, illustrated in FIG. 2.

(Step s120)

Next, the dummy glass substrate 110 having holes 130 is subjected to a heat treatment.

A condition for the heat treatment is determined based on the type of the dummy glass substrate 110 to be used, a degree of residual stress and/or a warpage of the dummy glass substrate 110. For example, the heat treatment may be performed so that when an annealing point of the dummy glass substrate 110 is $T_a$ (° C.), the maximum temperature $T_{max}$ falls within a range of $T_a \pm 10°$ C. The maximum temperature $T_{max}$ preferably falls within a range of $T_a \pm 5°$ C. Moreover, the heat treatment may be performed so that a retention time at the maximum temperature $T_{max}$ falls within a range from about 1 minute to 2 hours. The retention time preferably falls within a range from 1 hour to 2 hours.

Figure 5:
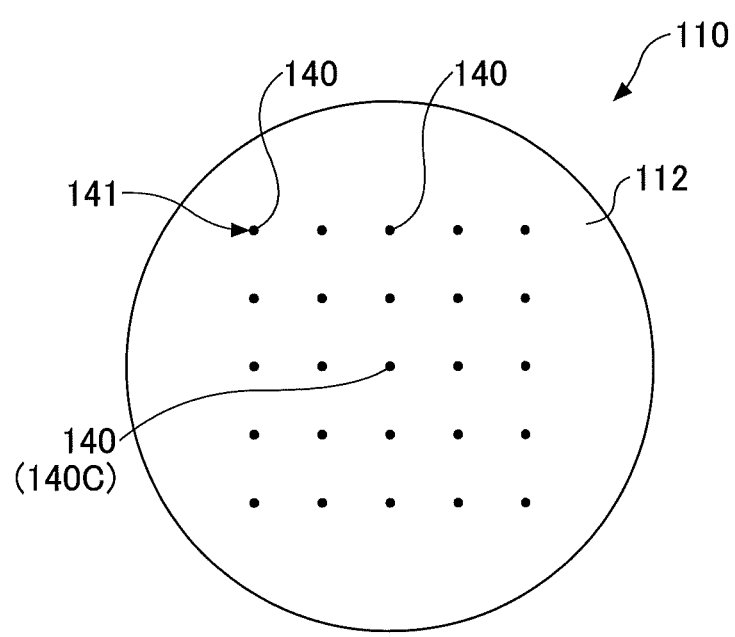
FIG. 5 is a diagram schematically depicting an example of the first surface of the dummy glass substrate after a heat treatment.

FIG. 5 schematically depicts an example of the first surface 112 of the dummy glass substrate 110 after the heat treatment.

As illustrated in FIG. 5, holes 140 of 5 rows×5 columns, i.e. 25 in total, are formed on the first surface 112 of the dummy glass substrate 110 after the heat treatment. In the following, the position where each hole 140 is arranged will be referred to as a "post heat treatment position (141)".

As described above, it should be noted that the post heat treatment position 141 of each hole 140 on the first surface 112 may deviate from the hole formation target position 120, illustrated in FIG. 2. However, in FIG. 5, in order to prevent the figure from becoming complicated, the post heat treatment position 141 of each hole 140 is shown to coincide with the hole formation target position 120, illustrated in FIG. 2.

(Step S130)

As described above, in a typical case, according to the first hole processing step (step S110) and the first heat treatment step (step S120), the post heat treatment position 141 of each hole 140 on the dummy glass substrate 110 deviates from the hole formation target position 120.

Then, in the present step S130, a position deviation behavior of each hole 140 from the hole formation target position 120 will be measured.

The processing in the present step will be described in detail giving an example, as follows.

Figure 6:
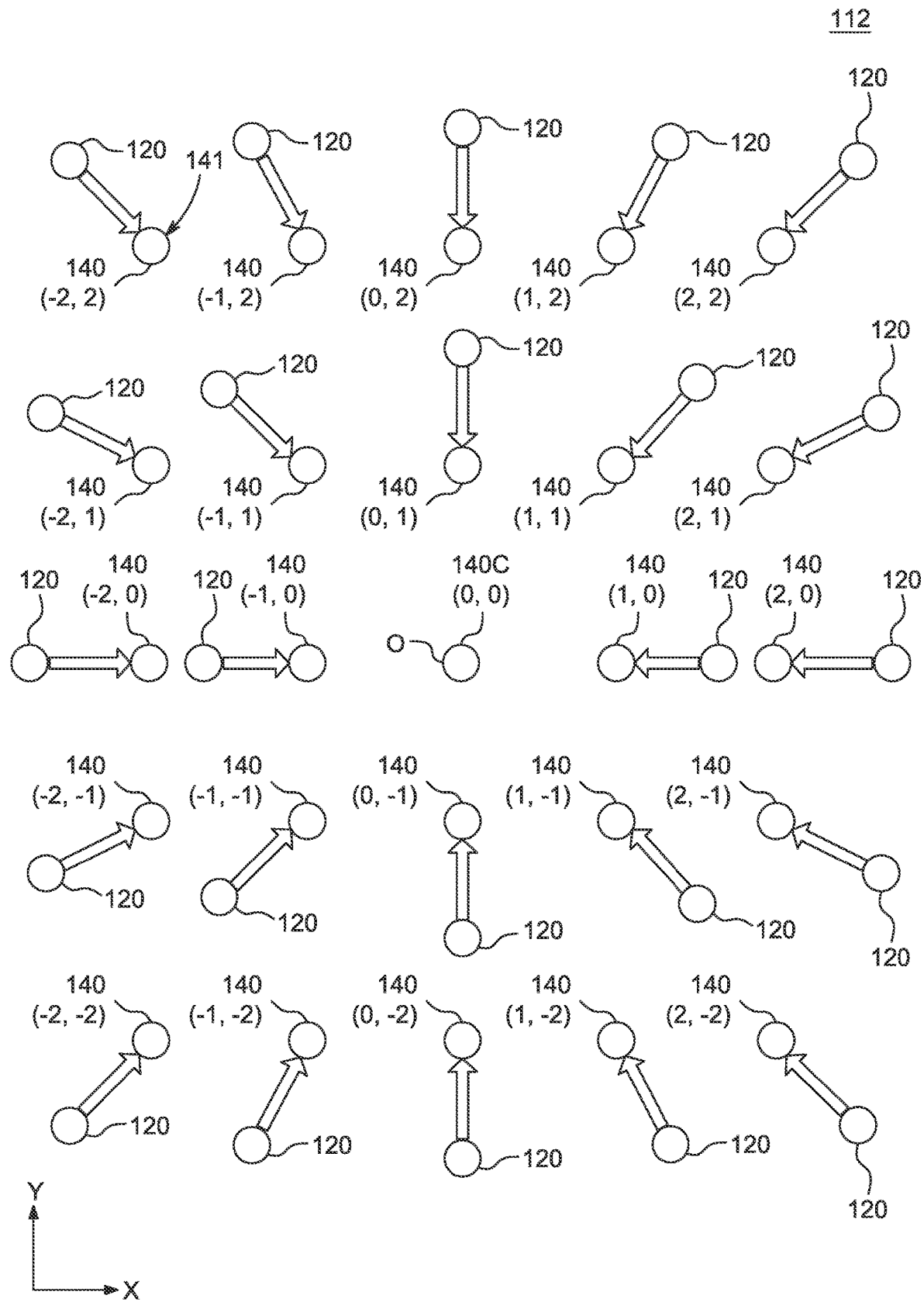
FIG. 6 is a diagram schematically depicting an example of the influence of a deviation from a hole formation target position for each hole obtained after a first heat treatment step.

FIG. 6 schematically depicts an example of an influence of the deviation of each hole 140 obtained after the first heat treatment step (S120) from the hole formation target position 120. In FIG. 6, by an arrow, a deviation of each hole 140 (tip of arrow) at the post heat treatment position 141 from the hole formation target position 120 (start point of arrow) is schematically illustrated.

In order to evaluate the amount of deviation of the post heat treatment position 141 at each hole 140 from the hole formation target position 120, as a reference point on the first surface 112, a "reference hole 140C" is set. The reference hole 140C is defined as a hole, among the holes at the post heat treatment positions 141 obtained after the first heat treatment step (S120), where the amount of deviation from the hole formation target position 120 is substantially zero.

For example, in FIG. 6, each hole 140 configuring an arrangement of the post heat treatment positions 141 is indicated by a coordinate (x,y) in an XY plane with the origin O(0,0) at the reference hole 140C, which is located in the center of the arrangement. For example, the origin O(0,0) may be the center of the dummy glass substrate 110.

The reference hole 140C, i.e. the coordinate O(0,0), can be used, by definition, as a reference for expressing a relative position of each hole after the processing in step S120.

For example, according to the first hole processing step (S110) and the first heat treatment step (S120) for the dummy glass substrate 110, the post heat treatment position 141 of each hole 140 varies as shown by an arrow in FIG. 6. That is, each hole 140 at the post heat treatment position 141 moves from the hole formation target position 120 toward the reference hole 140C of the origin O(0,0), in the direction of decreasing an absolute value of x and/or y of the coordinate.

Here, the length of each arrow corresponds to an amount of relative variation of each hole 140 at the post heat treatment position 141 from the hole formation target position 120 (in the following, referred to as a "deviation amount ΔP"). Thus, FIG. 6 shows that as the arrow of the hole 140 increases, the deviation amount ΔP becomes greater. However, it should be noted that the deviation amounts ΔP of the respective holes 140 from the hole formation target positions 120 shown in FIG. 6 are exaggerated.

Specifically, according to a distance from the origin O(0,0) to the hole formation target position 120, the deviation amount ΔP of the hole 140 is changed. As the distance d of the hole formation target position 120 increases, the deviation amount ΔP of the hole that corresponds to the hole formation target position 120 also increases. For example, the deviation amounts ΔP of the holes 140 located at the post heat treatment positions 141 of the coordinates (1, 1), (−1, 1), (−1, −1), and (1, −1) are almost the same. These deviation amounts ΔP are greater than the deviation amounts ΔP of the holes 140 located at the post heat treatment positions 141 of the coordinates (1, 0), (0, 1), (−1, 0), and (0, −1). Similarly, the deviation amounts ΔP of the holes 140 located at the post heat treatment positions 141 of the coordinates (2, 2), (−2, 2), (−2, −2), and (2, −2) are almost the same. These deviation amounts ΔP are greater than the deviation amounts ΔP of the holes 140 located at the post heat treatment positions 141 of the coordinates (2, 1), (1, 2), (−1, 2), (−2, 1), (−2, −1), (−1, −2), (1, −2), and (2, −1).

Between the distance d and the deviation amount ΔP, an approximately linear relationship (proportional relationship) can be found. A slope m of a straight line satisfies a relation: m=ΔP/d.

By using such XY coordinates, a state on the dummy glass substrate 110 in which a position of the hole 140 deviates from the hole formation target position 120, can be determined.

Note that a position deviation behavior of the arrangement of the holes 140, illustrated in FIG. 6, is merely an example. In the arrangement of post heat treatment holes 140, positions of the holes may deviate in a different manner. Moreover, for example, the origin O of the XY coordinate is not necessarily required to be a hole 140 located at the center of the arrangement. The hole 140 as the origin O of the XY coordinate may be optionally selected.

(Step S140)

Next, a glass substrate that is an object to be processed (for example, a product), i.e. a glass substrate for main processing is prepared. As described above, the glass substrate for main processing is a substrate having at least substantially the same shape, dimension and composition as those of the dummy glass substrate. The glass substrate for main processing may be substantially the same glass substrate as the dummy glass substrate 110.

Next, in step S110, described as above, a plurality of holes are formed in the glass substrate for main processing under the "first condition" applied to the case of forming holes 130 in the dummy glass substrate 110. Thus, it is possible to form holes in the glass substrate for main processing in almost the same manner as the holes 130 formed in the dummy glass substrate 110.

However, it should be noted that in step S140, the irradiation position of laser light on the glass substrate for main processing is different from the case of the dummy glass substrate 110. That is, the irradiation position of laser light on the glass substrate for main processing is determined taking into account the deviation amounts ΔP from the hole formation target positions 120 for the respective holes 140, which were measured in step S130.

In the following, as an example, a case where holes are arranged in a matrix shape of 5×5 at the "hole formation target positions" on the glass substrate for main processing is assumed. The "hole formation target position" on the glass substrate for main processing means, as described above, a target position at which each hole will be arranged after the subsequent second heat treatment step (step S150).

Figure 7:
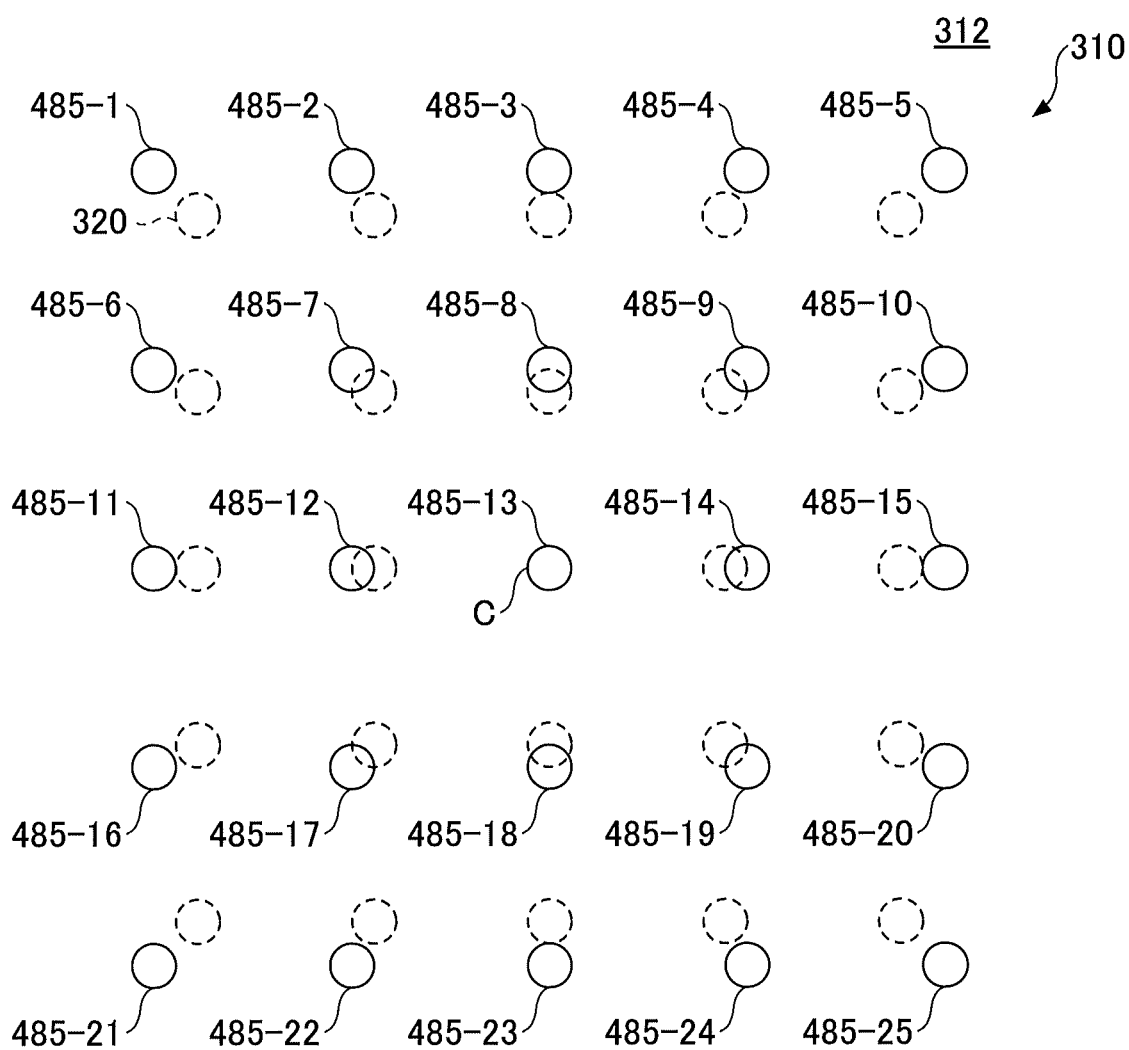
FIG. 7 is a diagram schematically depicting an example of the arrangement of irradiation positions of laser light on a glass substrate for a main processing.

In this case, the arrangement of the irradiation positions of laser light on the glass substrate for main processing is shown as illustrated in FIG. 7.

FIG. 7 schematically depicts an example of the arrangement of the irradiation positions of laser light on the first surface of the glass substrate for main processing.

As illustrated in FIG. 7, the irradiation positions 485 (485-1 to 485-25) of respective laser lights on the first surface 312 of the glass substrate for main processing 310 is arranged in a matrix shape of 5×5 on the XY plane. Note that the irradiation position 485-13 is a reference hole, and is arranged at a center C of the hole formation target positions 320. The position may be a center of the first surface 312 of the glass substrate for main processing 310. Moreover, in FIG. 7, the hole formation target positions 320 are indicated by dashed circles.

As illustrated in FIG. 7, the irradiation positions 485 (485-1 to 485-25) of respective laser lights are arranged at positions which were corrected by the deviation amounts ΔP shown in FIG. 6.

The irradiation positions 485 of laser light are obtained as follows. The reference hole of the glass substrate for main processing 310 is set to the origin O(0,0), and a coordinate of the irradiation position 485 is denoted by (a, b), and a coordinate of the hole formation target position 320 is denoted by (x, y). A correction coefficient α is defined by a=α×x and b=α×y.

Moreover, the correction coefficient a satisfies an equation: α=d/(d−ΔP). When the numerator and the denominator of the right hand side of the equation are divided by d, respectively, an equation α=1/(1−ΔP/d) is obtained. Furthermore, when the above-described slope m in the proportional relation between the distance d and the deviation amount ΔP is applied, the correction coefficient is expressed by α=1/(1−m), i.e. the correction coefficient can be obtained from the slope m. With the obtained correction coefficient a, coordinate values (x, y) of the hole formation target position 320, using the relations a=α×x and b=α×y, the coordinate of the irradiation position (a, b) is obtained.

For example, the irradiation positions of laser light 485-8, 485-12, 485-14 and 485-18 are arranged along straight lines connecting the center C and the respective hole formation target positions 320, so as to move outward by a first distance from the hole formation target positions 320, respectively. Moreover, the irradiation positions 485-7, 485-9, 485-17 and 485-19 are arranged along straight lines connecting the center C and the respective hole formation target positions 320, so as to move outward by a second distance from the hole formation target positions 320, respectively. The second distance is greater than the first distance.

Note that for the irradiation position 485-13 arranged at the center C, a hole position does not change a position, by its definition, even when the subsequent second heat treatment step (step S150) is performed. Thus, the irradiation position 485-13 is already arranged at the hole formation target position 320 in this stage.

Next, the above-described irradiation positions 485 on the first surface 312 of the glass substrate for main processing 310 are irradiated with laser light, and a plurality of holes are formed.

In the case where holes are formed by using the above-described method, in the subsequent step S150, when the glass substrate for main processing 310 is subjected to the heat treatment, the respective holes after the heat treatment can be arranged at the hole formation target positions 320, respectively.

(Step s150)

Next, a heat treatment is performed for the glass substrate for main processing 310, in which the holes have been formed, as described above.

A heat treatment condition in this step is substantially the same as the heat treatment condition for the heat treatment performed for the dummy glass substrate 110.

When the glass substrate for main processing 310 is subjected to the heat treatment, each hole after the heat treatment can be arranged at a desired position on the glass substrate for the main processing 310, i.e. at the hole formation target position 320. For example, in the case of irradiating the glass substrate with laser light according to the arrangement of the irradiation positions 485, illustrated in FIG. 7, to form holes, after heat-treating the glass substrate for main processing 310, each hole can be arranged at the hole formation target position 320 indicated by the dashed circle.

According to the above-described steps, in the first method, it is possible to arrange the respective holes with high accuracy at the hole formation target positions 320 on the glass substrate for main processing 310 after the heat treatment.

(Manufacturing Method of Glass Substrate Having Holes According to Another Embodiment of Present Invention)

A manufacturing method of a glass substrate having holes according to another embodiment of the present invention will be described. Specifically, before irradiating the "hole formation target position" on the first surface 112 of the dummy glass substrate 110 with laser light in step S110, and before irradiating the first surface of the glass substrate for main processing with laser light in step S140, a heat treatment (in the following, referred to as a pre-annealing) may be performed. Processing of the other steps is the same as the above-described processing which was described with reference to FIG. 1 and the like, and description thereof will be omitted.

By performing the pre-annealing, the glass substrate can be prevented from shrinking due to the heat treatment after the hole processing by the laser light irradiation. By the pre-annealing, a hole position can be prevented from deviating from a predetermined position due to the influence of the heat treatment after the hole formation. However, the position deviation during the hole processing due to the laser light irradiation cannot be suppressed. Thus, as described above, the position deviation of the hole processing can be suppressed by measuring a position deviation using the dummy glass substrate, performing the hole processing according to the laser light irradiation taking into account a position deviation amount for the glass substrate for main processing, and performing the heat treatment.

For a condition for the pre-annealing, the above-described condition for the heat treatment described in step S120 may be used.

(Manufacturing Method of Interposer Substrate According to Embodiment of Present Invention)

Next, a manufacturing method of an interposer substrate according to an embodiment of the present invention will be described with reference to FIG. 8.

Figure 8:
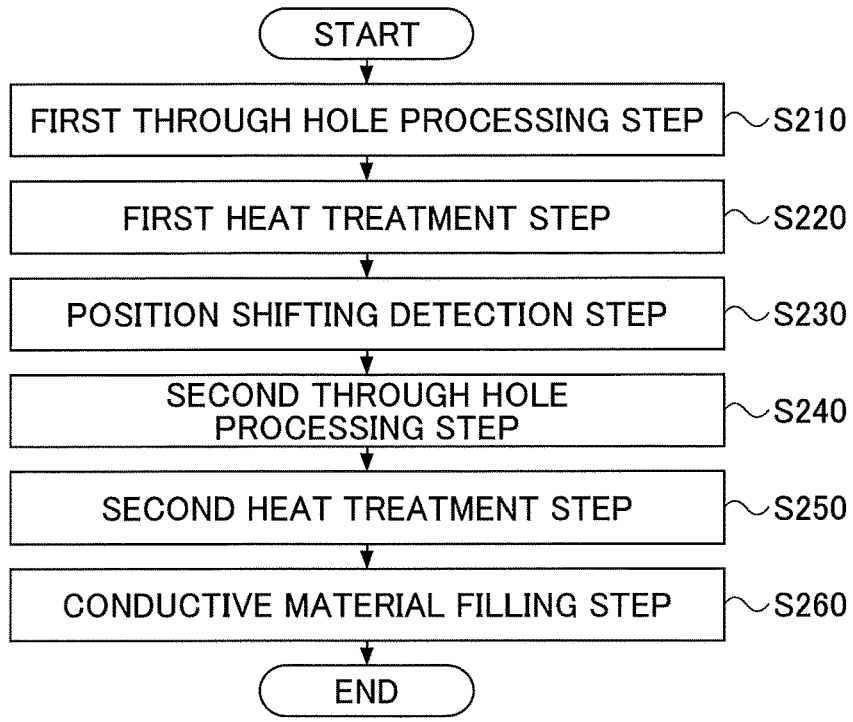
FIG. 8 is a flowchart schematically depicting an example of the flow of a manufacturing method of an interposer substrate according to the embodiment of the present invention.

FIG. 8 is a flowchart schematically depicting a flow of the manufacturing method of an interposer substrate (a glass substrate having a through electrode) according to the embodiment of the present invention (in the following, simply referred to as a "second method").

As shown in FIG. 8, the second method includes (a) a first through hole processing step of irradiating a plurality of through hole formation target positions on a dummy glass substrate with a laser light under a first condition using a laser light, to form a plurality of through holes in the dummy glass substrate (step S210);

(b) a first heat treatment step of heat-treating the dummy glass substrate (step S220);

(c) a position deviation measuring step of measuring, for each of the through hole formation target positions, a deviation between the through hole formation target position and a position of the through hole after the heat treatment in the step (b) (step S230);

(d) a second hole processing step of irradiating irradiation target positions of a glass substrate, having substantially same shape, dimension and composition as those of the dummy glass substrate, with a laser light under the first condition using a laser light, to form a plurality of through holes, the irradiation target positions of the glass substrate with the laser light being determined taking into account the amounts of deviation measured in the step (c) (step S240);

(e) a second heat treatment step of heat-treating the glass substrate under a heat treatment condition that is applied to the step (b) (step S250); and (f) a conductive material filling step of filling a conductive material in the through hole in the glass substrate, is provided.

Among the above-described steps, steps S210 to S250 are substantially the same as steps S110 to S150 in the first method, respectively. However, in the second method, when steps S110 to S150 are referred to, a term including "hole" is required to be replaced by a term including "through hole". For example, the "hole formation target position" is replaced by the "through hole formation target position", and the "hole proceeding device" is replaced by the "through hole processing device".

In the following, step S260 will be described in detail.

(Step S260)

Through step S210 to step S250, a glass substrate in which each through hole is arranged at a through hole formation target position can be obtained.

In the next step S260, a conductive material is filled in each through hole.

The conductive material is not particularly limited, and may be a metal such as copper, silver, or gold, or an alloy thereof.

The method of filling the conductive material into a through hole is not particularly limited. The conductive material may be filled in the through hole by using a plating method such as an electrolytic plating method or an electroless plating method. Techniques for filling such conductive material are well known for a person skilled in the art.

According to the processing in the steps described above, an interposer substrate in which a conductive material is filled in the through hole can be manufactured.

As described above, each through hole is disposed at a predetermined position on the glass substrate with high accuracy.

Accordingly, in the second method, an interposer substrate having a conductive via at a predetermined position with high accuracy can be manufactured.

As described above, the embodiment of the present application has been described with the first method and the second method as an example. However, the present invention may be implemented in other forms.

For example, in another embodiment of the present invention, a method for forming a hole in a glass substrate, having the same steps as the first method, may be provided. In such a method, according to the above-described features, a hole can be formed in the glass substrate with high accuracy.

EXAMPLE

In the following, practical examples of the present invention will be described.

Using the above-described first method, a glass substrate having holes is manufactured according to the following procedure.

For a glass substrate for main processing, a non-alkali glass having a rectangular shape with a dimension of 150 mm×150 mm×thickness 0.3 mm was used. The annealing point Ta of the glass substrate for main processing was 710° C. For the dummy glass substrate, the same material as the glass substrate for main processing was used.

First, using the laser processing device as described above, the hole formation target positions of the dummy glass substrate were irradiated with laser light. The hole formation target positions were an arrangement of holes, arranged at equal intervals, of 5 rows×5 columns, i.e. 25 in total.

For laser light, a $CO_2$ laser was used. A laser light power was 50 W. A spot diameter of laser light was 70 μmϕ.

According to the irradiation of laser light, an arrangement pattern of holes, as illustrated in FIG. 4, was formed on the dummy glass substrate. Note that the arrangement pattern of holes was arranged so that a hole at the center of the pattern was set to be a reference hole, and the reference hole was arranged at the center of the dummy glass substrate. A target of a pitch between the holes was 20 mm (20000 μm) in the X-direction and the Y-direction.

Next, a heat treatment was performed for the dummy glass substrate. The heat treatment was performed by holding the dummy glass substrate at 710° C. for 2 hours.

After the heat treatment, positions of the respective holes arranged on the dummy glass substrate were observed using the reference hole as a reference, and the positions of the respective holes were found to deviate from the hole formation target positions.

More specifically, the positions of the respective holes after the heat treatment moved, along lines connecting the hole formation target positions and a center C of the reference hole, toward the center C. Moreover, amounts of movement increased, as distances between the positions of the holes and the center C increased.

Figure 9:
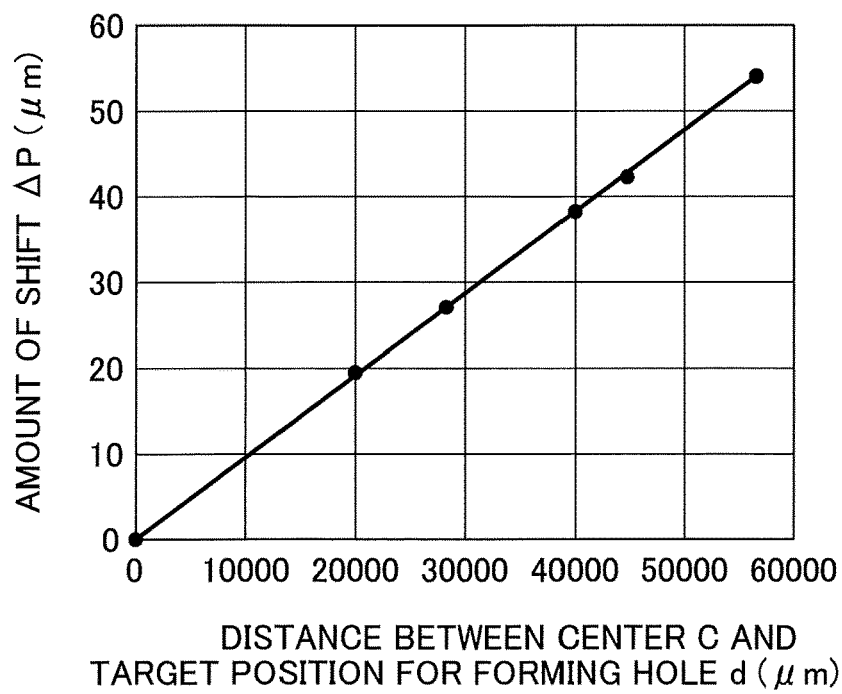
FIG. 9 a graph showing a relation between the distance d (μm) to a hole formation target position and the amount of deviation ΔP (μm) from the hole formation target position obtained for each hole in the dummy glass substrate after the heat treatment.

FIG. 9 shows deviation amounts ΔP (μm) from the hole formation target positions, obtained for the respective holes in the dummy glass substrate after the heat treatment.

Note that in FIG. 9, the horizontal axis represents a distance d (μm) between the center C of the reference hole and the hole formation target position of each hole, and the vertical axis represents an amount of change of the hole at the post heat treatment position from the hole formation target position, i.e. a deviation amount ΔP (μm).

It is found that, from FIG. 9, an approximately linear relationship holds between the distance d and the deviation amount ΔP. The slope m (=ΔP/d) of the straight line was 0.00095.

Next, under the same irradiation condition of laser light as that applied to the dummy glass substrate, the glass substrate for main processing was irradiated with laser light, to form a pattern of holes in a matrix shape of 5×5. Note that a hole at the center of the pattern was set to be a reference hole, and formed at the central position of the glass substrate for main processing.

Note that a position taking into account the relation between the distance d and the deviation amount ΔP, obtained in FIG. 9 (m=0.00095) was irradiated with laser light.

In the following, with reference to FIG. 10, a specific determination operation for a position on the glass substrate for main processing irradiated with laser light will be described.

Figure 10:
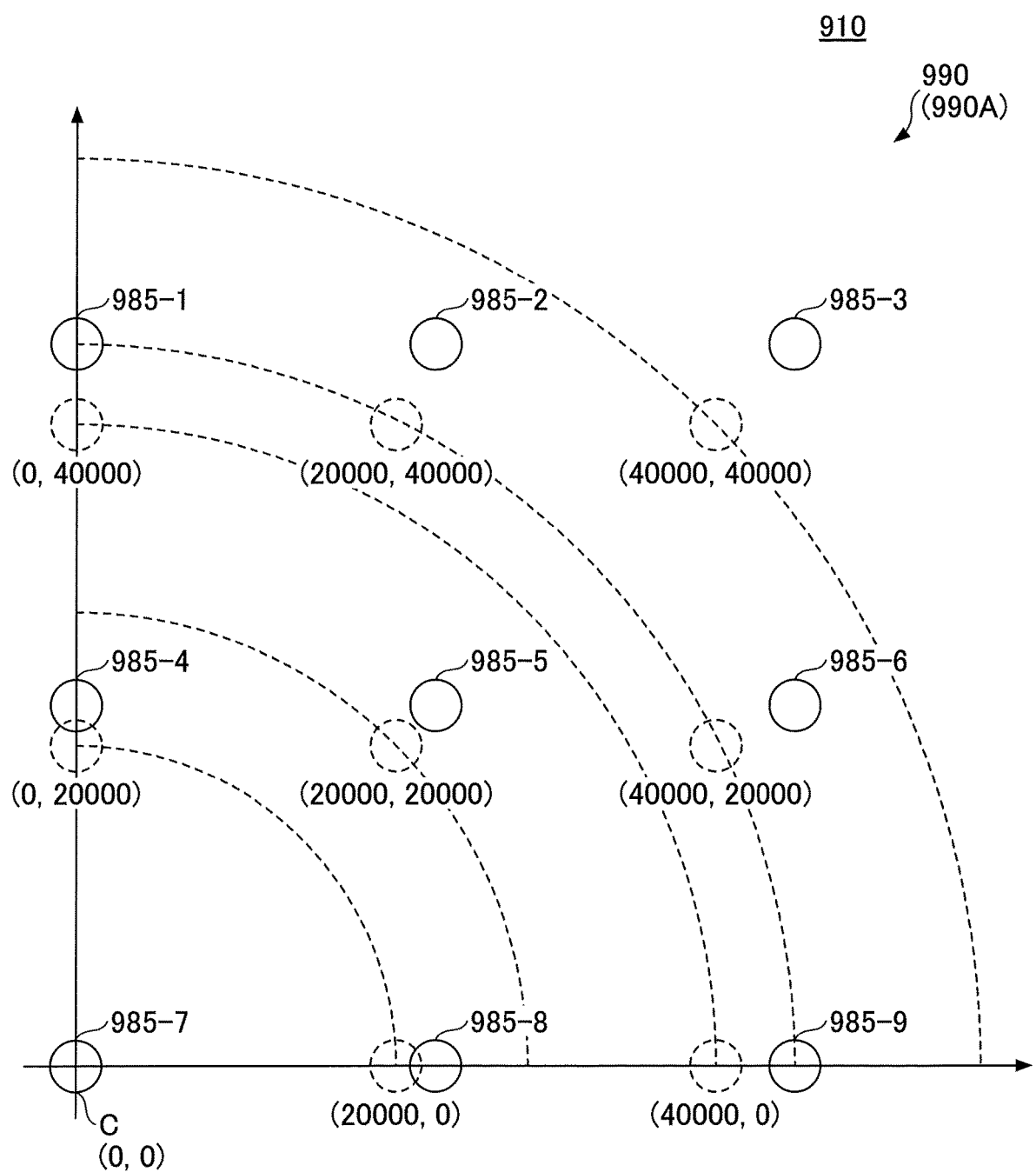
FIG. 10 is a diagram for describing an operation when irradiation positions of laser light on the glass substrate for the main processing are determined.

FIG. 10 depicts an example of a first part 990A of an arrangement 990 at a laser light irradiation position 985 on a glass substrate for main processing 910. The first part 990A of the arrangement 990 is configured of laser light irradiation positions 985-1 to 985-9.

FIG. 10 illustrates the respective irradiation positions 985-1 to 985-9, so that the irradiation position 985-7 at the center of the arrangement 990 is located at the origin O(0,0) of the XY-plane.

Moreover, FIG. 10 indicates hole formation target positions of the respective holes by dashed circles. For example, a hole formation target position of a hole corresponding to the irradiation position 985-1 is indicated by a coordinate (0, 40000), a hole formation target position of a hole corresponding to the irradiation position 985-5 is indicated by a coordinate (20000, 20000), and a hole formation target position of a hole corresponding to the irradiation position 985-9 is indicated by a coordinate (40000, 0).

Note that, although not shown in FIG. 10, the arrangement 990 is configured of 25 irradiation positions arranged in a matrix shape of 5×5, where the center of the arrangement 990 is the irradiation position 985-7.

For example, a part of the irradiation positions configuring the arrangement 990 (e.g. the second part of the arrangement) are arranged at positions symmetric to the irradiation positions 985-1 to 985-9, illustrated in FIG. 10, with respect to the Y axis, respectively.

Moreover, another part of the irradiation positions configuring the arrangement 990 (e.g. the third part of the arrangement) are arranged at positions symmetric to the irradiation positions 985-1 to 985-9, illustrated in FIG. 10, with respect to the X axis, respectively. Furthermore, yet another part of the irradiation positions configuring the arrangement 990 (e.g. the fourth part of the arrangement) are arranged at positions obtained by rotating the irradiation positions 985-1 to 985-9, illustrated in FIG. 10, around the origin O by 180 degrees, respectively.

In the above-described notation, an irradiation position 985 configuring the first part 990A of the arrangement 990 in the glass substrate for main processing 910 before irradiation with laser light, i.e. an XY coordinate (a, b) is expressed by a=αx, b=αy, where the coordinate of the hole formation target position is (x, y), and a correction coefficient is a. From the result, described as above, the correction coefficient is α=d/(d−ΔP)=1/(1−m)=1.00095.

For example, for the irradiation position 985-1, because the coordinate of the hole formation target position (x, y) is (0, 40000), the coordinate is calculated as a=α×0=0, and b=α×40000=40038, as a result the coordinate is (a, b)=(0, 40038). Similarly, for the irradiation position 985-2, because the coordinate of the hole formation target position (x, y) is (20000, 40000), the coordinate is calculated as a=α×20000=20019, and b=α×40000=40038, as a result the coordinate is (a, b)=(20019, 40038). Moreover, for the irradiation position 985-5, because the coordinate of the hole formation target position (x, y) is (20000, 20000), the coordinate is calculated as a=α×20000=20019, and b=α×20000=20019, as a result the coordinate is (a, b)=(20019, 20019). Furthermore, for the irradiation position 985-9, because the coordinate of the hole formation target position (x, y) is (40000, 0), the coordinate is calculated as a=α×40000=40038, and b=α×0=0, as a result the coordinate is (a, b)=(40038, 20019).

As described above, with the irradiation positions 985-1 to 985-9 present in the first part 990A configuring the arrangement 990 of the irradiation positions of laser light as examples, a determination operation for the positions has been described. However, also for the part configuring the arrangement 990 of the laser light irradiation positions, other than the first part 990A, by using the same operation, the respective irradiation positions can be determined.

For example, in the above-described operation, the respective irradiation positions included in the first quadrant in the XY plane where the irradiation position 985-7 is the origin can be determined. Also for the irradiation positions included in the second quadrant, the third quadrant, or the fourth quadrant in the XY plane where the irradiation position 985-7 is the origin, the respective positions can be determined by using the same operation.

The irradiation positions 985 determined as above were irradiated with laser light, and thereby 25 holes were formed in the glass substrate for main processing.

Next, for the glass substrate for main processing was subjected to the heat treatment under the above-described condition (retaining at 710° C. for two hours). Moreover, a position of each hole (post heat treatment position) in the glass substrate for main processing after the heat treatment was measured.

Figure 11:
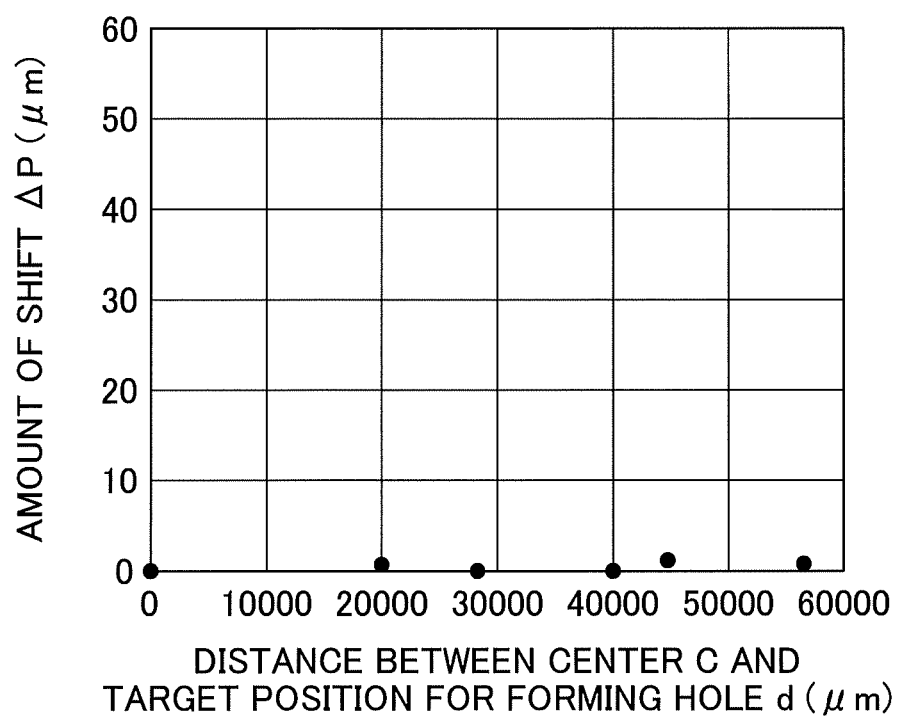
FIG. 11 is a diagram showing the amount of deviation ΔP (μm) from the hole formation target position for each hole in the glass substrate for the main processing after the heat treatment.

FIG. 11 shows deviation amounts ΔP (μm) of the respective holes after the heat treatment in the glass substrate for main processing from the hole formation target positions.

Note that, in FIG. 11, the horizontal axis indicates a distance d (μm) from the center of the reference hole to the hole formation target position, and the vertical axis indicates a distance between the post heat treatment position and the hole formation target position of each hole, i.e. a deviation amount ΔP (μm).

As shown in FIG. 11, in the glass substrate for main processing after the heat treatment, the post heat treatment positions of the holes are found to substantially coincide with the respective hole formation target positions. For example, even for the hole with the greatest deviation amount ΔP located at a position separated from the center C by the distance d of about 45000 μm, the deviation amount ΔP is suppressed to only about 1.5 μm.

The above-described result suggests that a hole can be arranged in a glass substrate for main processing after a heat treatment with a quite excellent accuracy, taking into account that a positioning accuracy of the laser processing device used in the example is about ±5 μm.

Thus, it is confirmed that, by using the method according to the embodiment of the present invention, after a heat treatment, holes can be arranged with high accuracy at hole formation target positions on a glass substrate for main processing, respectively.

INDUSTRIAL APPLICABILITY

The present invention can be applied to a technique for forming a hole such as a through hole in a glass substrate, a manufacturing technique of an interposer substrate, and the like.

REFERENCE SIGNS LIST 110 dummy glass substrate
112 first surface
114 second surface
116 irradiation position
120 hole formation target position
130 hole
131 hole processing position
140 hole (after heat treatment)
140C reference hole
141 post heat treatment position
200 laser processing device
210 laser light source
213 laser light
245 sample stage
310 glass substrate for main processing
312 first surface
320 hole formation target position
485 (485-1 to 485-25) irradiation position of laser light
910 glass substrate for main processing
985 (985-1 to 985-9) irradiation position of laser light
990 arrangement
990A first part

What is claimed is:

1. A manufacturing method of a glass substrate having holes, comprising:
   irradiating a plurality of hole formation target positions of a dummy glass substrate with a laser under a first condition, to form a plurality of holes in the dummy glass substrate;
   heating the dummy glass substrate under a second condition;
   measuring, for each of the hole formation target positions, a deviation between the hole formation target position and a position of the hole after the heating formed by irradiating the hole formation target position of the dummy glass substrate with a laser;
   irradiating irradiation target positions of a glass substrate, having the same shape, dimension and composition as the dummy glass substrate, with a laser under the first condition, to form a plurality of holes; the irradiation target positions of the glass substrate with the laser being determined taking into account the deviation; and
   heating the glass substrate under the second condition.

2. The manufacturing method according to claim 1, wherein the holes after the heating formed by irradiating the hole formation target positions of the dummy glass substrate with a laser include a reference hole, a position of which is not changed from the hole formation target position, and
   wherein each of the irradiation target positions of the glass substrate with the laser is determined by using
   a correction coefficient $\alpha = d/(d-\Delta P)$
   where $\Delta P$ (μm) is an amount of the deviation, and $d$(μm) is a distance between a center of the reference hole in the dummy glass substrate and the hole formation target position.

3. The manufacturing method according to claim 2, wherein the reference hole is arranged at a center of the dummy glass substrate.

4. The manufacturing method according to claim 1, wherein the glass substrate is heated to a temperature, which falls within a range from $T_a-10°$ C. to $T_a+10°$ C., $T_a$ (° C.) being an annealing point of the glass substrate, for a time period which falls within a range from one minute to two hours.

5. The manufacturing method according to claim 1, wherein the holes are through holes.

6. A manufacturing method of an interposer substrate, comprising:
   irradiating a plurality of through hole formation target positions of a dummy glass substrate with a laser under a first condition, to form a plurality of through holes in the dummy glass substrate;

heating the dummy glass substrate under a second condition;

measuring, for each of the through hole formation target positions, a deviation between the through hole formation target position and a position of the through hole after the heating formed by irradiating the through hole formation target position of the dummy glass substrate with a laser;

irradiating irradiation target positions of a glass substrate, having the same shape, dimension and composition as the dummy glass substrate, with a laser under the first condition, to form a plurality of through holes, the irradiation target positions of the glass substrate with the laser being determined taking into account the deviation;

heating the glass substrate under the second condition; and filling a conductive material in the through holes in the glass substrate.

\* \* \* \* \*